METALLIC CONTACTS FOR SEMICONDUCTOR DEVICES

Filed Oct. 21, 1964 2 Sheets-Sheet 1

James A. Cunninghan
Robert P. Williams
INVENTORS

BY John E. Vandigriff
ATTORNEY

METALLIC CONTACTS FOR SEMICONDUCTOR DEVICES

Filed Oct. 21, 1964 2 Sheets-Sheet 2

James A. Cunninghan
Robert P. Williams
INVENTORS

BY John E. Vandigriff
ATTORNEY

United States Patent Office 3,341,753

Patented Sept. 12, 1967

3,341,753

METALLIC CONTACTS FOR SEMICONDUCTOR DEVICES

James A. Cunningham, Dallas, and Robert P. Williams, Plano, Tex., assignors to Texas Instruments Incorporated, Dallas, Tex., a corporation of Delaware Filed Oct. 21, 1964, Ser. No. 405,461
13 Claims. (Cl. 317—234)

ABSTRACT OF THE DISCLOSURE

A multilevel expanded ohmic contact to a semiconductor device where the ohmic contact includes a molybdenum film and an overlying layer of highly conductive metal as aluminum. The molybdenum and aluminum films may be deposited by evaporation techniques described herein.

This invention relates to semiconductor devices, and more particularly to metal contacts for transistors, integrated circuits, or the like, and to methods for making such contacts.

Electrical contacts to semiconductor devices must be composed of materials which have good chemical, electrical, thermal and mechanical properties when applied to semiconductor surfaces. While problems in making contacts exist for all semiconductors, the selection of contact material is especially difficult when the semiconductor is silicon, such as in planar transistors and integrated circuits where silicon is most commonly used. First, it is appropriate to discuss the restrictions within which a contact metal for a silicon planar device must be selected.

In planar semiconductor devices, a silicon oxide or glass coating usually overlies the silicon surface except in the actual contact areas, this coating functioning to passivate the junctions and provide an insulating base for expanded contacts and interconnections. Particularly in integrated circuits, strips of conductive material extend from one semiconductor region up over the oxide coating and across various regions and junctions of the device to contact another region. Accordingly, the contact material must exhibit good adherence to silicon and to silicon oxide or glass, but yet must not produce any undesirable reaction with, nor penetrate, the silicon or oxide.

The most successful techniques thus far devised for the manufacture of semiconductor devices and particularly silicon transistors and integrated circuits, rely heavily upon photoengraving to form diffusion masks, define contact areas, etc., and upon evaporation to deposit metals. Therefore, to be compatible with the most convenient manufacturing methods, the contact metal selected should permit the use of photomasking and etching, and also should permit evaporation as a technique for deposition. These techniques for applying the contact material are most effective when very thin films are used, and since the other dimensions of the conductor are limited in size by the desired electrical characteristics of the device, the contact material must have a high conductivity to prevent the introduction of series resistance.

There is a continuing trend in semiconductor technology to fabricate devices operable at higher frequencies and capable of switching at higher speeds. Of necessity, the physical dimensions of the device must be made very small to provide these characteristics. For example, the part of a high frequency transistor which functions as the emitter region may occupy one-tenth square mil or less on the face of a semiconductor wafer, and may be only a few hundredths of a mil in depth. Connection cannot be made directly to such a region with a bonded wire, so the contact area must be expanded out over the oxide to make room for attaching an external lead, requiring the contact metal to be unreactive with the oxide as above. In transistors of this type, the oxide layer overlying the base region is very thin because of the short time during which the device can be held at temperatures which promote oxide growth. Typically, this oxide layer would be less than 2000 A., compared to almost 10,000 A. over the collector region. Therefore, degradation of the device due to penetration of the contact metal through the oxide to the junctions would be particularly severe in high frequency devices. Also, the contact metal must not tend to penetrate into the semiconductor surface since very slight penetration would obliterate the shallow region.

The contact metal should not form an alloy with the semiconductor material at temperatures used in bonding leads to, or packaging, the device. Formation of such an alloy would result in the undesirable penetration of the contact metal into the shallow semiconductor regions. This limitation prevents the use of aluminum in direct contact with silicon because of its low eutectic temperature with silicon, 577° C., a temperature often exceeded in depositing contact metals, in bonding or in hermetically sealing the device. In like manner, the contact metal should not have a melting point below that to which the device would be exposed in subsequent processing and operation.

An additional requirement for a contact metal is that it provide an ohmic and low resistance contact to the semiconductor surface. If the device is made of silicon, particular problems occur because of the inherent properties of the material, the propensity of this semiconductor for forming an oxide, etc. Moreover, if the contact metal used is a donor or acceptor in the semiconductor, it must have a low solubility so that the tendency to form a junction can be thwarted by heavy doping of the contact area.

With these limitations, most metals are totally unsuited for use alone as expanded contacts to silicon devices. For example, the best conductors, silver, copper and gold, do not adhere well to silicon oxide, and in addition gold forms a eutectic with silicon at low temperature, degrading device characteristics. Also, silver oxidizes rapidly so a bond cannot be made easily, while copper diffuses very rapidly in silicon. Examining the other metals, it will be noted that tungsten and molybdenum do not permit bonding with gold wire, the former being additionally difficult to etch in a controlled manner using solvents compatible with photoresist polymers, silicon oxide, etc. Rhodium and iridium do not adhere to silicon oxide and are not readily etched. Zinc has a low melting point, does not adhere to silicon oxide, and has an undesirably high vapor pressure. Cobalt is difficult to evaporate. Nickel does not adhere well to silicon oxide and is difficult to bond with gold wire. Iron cannot be readily bonded. Platinum and palladium adhere poorly to silicon oxide, and are difficult to be bonded with gold wire. Tin has a very low melting point. Chromium cannot be be readily etched nor bonded with gold wire, is too porous and unduly reactive with silicon oxide. Tantalum is even more difficult to etch and bond and is even more reactive with silicon oxide than chromium. Lead exhibits poor adherence to silicon oxide. Vanadium, zirconium and titanium are very poor conductors, react with silicon oxide, and are virtually impossible to bond with gold wire, while the latter two suffer the additional disadvantage of being difficult to etch. Indium has a very low melting point. Antimony, arsenic, and gallium are doping impurities with high solubilities and/or diffusion rates in silicon, while gallium melts at slightly above room temperature.

The only single metal which is at all suitable for contacts and interconnections in silicon planar transistors and integrated circuits is aluminum, which has been used widely for such purposes. Aluminum thin films of excellent quantity are easily applied to semiconductor devices by evaporation and photoresist techniques, and contacts of this metal are readily bondable with gold or aluminum wires. Aluminum is the fourth best conductor, and its adherence to silicon and silicon oxide is possibly unsurpassed.

Nevertheless, despite its several advantages for use as a contact material in semiconductor devices, aluminum has a disadvantage.

This disadvantage is encountered when aluminum is used as an expanded contact or interconnection, or when it is applied over the entire surface of a silicon planar device and then selectively removed except in desired contact areas. There is evidence that the application of aluminum films by mean of evaporation sometimes results in electrical degradation of the device in the form of shorts, high saturation currents, decreased gain, and undesirably low reverse breakdown characteristics. This degradation is particularly severe when the thermal oxide and/ or glass coating over the junction is thin, which is usually the case in high frequency planar transistors. The origin of this degradation is obvious if the oxide coating contains pinholes; however, recent work indicates that aluminum has a tendency to cause electrical degradation in excess of that which can be attributed to pinholes in the oxide. It is believed that aluminum has a tendency to penetrate the protective oxide, probably due to a chemical reaction between aluminum and silicon oxide. This chemical reaction, expressed by the formula $3SiO_2+4Al \rightarrow 2Al_2O_3+3Si$, is very energetically favorable, the free energy of formation under standard conditions, $\Delta°$ F., being $-184$ kcal/mole for this reaction. For aluminum the $\Delta°$ F. for oxide formation is about $-376$, whereas for silicon it is $-192$, the difference providing the $-184$ figure. The excellent adherence of aluminum to silicon oxide is due to this reaction. Presumably, aluminum films applied to silicon oxide surfaces are held firmly due to an interfacial reaction of this type, but it is interesting to note that the reaction is also probably responsible for the electrical degradation that is observed.

Efforts have been expanded toward finding an alloy of metals which will satisfy the requirements for silicon contacts, but the possibility of finding a suitable material by this approach is made difficult by the necessity that the contact metal is preferably applied by evaporation. The constituent metals selected must have vapor pressures very nearly equal or the alloy as such cannot be formed on a substrate by evaporation. Even if the vapor pressures are very close, the materials applied by evaporation may well resemble a mixture rather than an alloy, and heat treatment at very near the melting point of the alloy is necessary to reform the original composition. Ordinarily such temperatures are incompatible with a semiconductor device. In any event, the metals in an alloy may exhibit a tendency to etch preferentially in the photoengraving processes.

Attepts to find a single metal or alloy as a substate for aluminum have not been entirely successful. This, it becomes necessary to employ a multilayered or sandwich type contact. For example, chromium and gold have been proposed as a contact, in which case a thin layer of chromium is applied first then a layer of gold is deposited over the chromium. Unfortunately, chromium exhibits relatively poor electrical contact to silicon, and is not itself a very good conductor. In addition, chromium does not prevent the penetration of gold into the silicon, and in fact this penetration is used to promote lower contact resistance, the CrAu films being sintered after deposition. Also, chromium is subject to severe undercutting during etching in the photoengraving process, since chromium is difficult to etch in a slow, controlled manner.

With the difficulties heretofore encountered in mind, it is the object of this invention to provide improved contacts and interconnections for semiconductor devices, particularly silicon planar transistors and integrated circuits of the type having silicon oxide coatings thereon. Generally, the object is to use materials which do not tend to degraded the semiconductor device by their presence, which lend themselves to manufacturing techniques compatible with other processes used on the devices, and which permit working with very small geometries. In the specific case of silicon planar devices, the object is to provide a contact and interconnection arrangement which adheres well to silicon and to silicon oxide surfaces without reacting unfavorably with either, which can be used with available photoresist masking and etching procedures, which forms an ohmic and low resistance electrical connection to silicon, which can be applied readily by metal evaporation techniques, which has a high conductivity, and which can be bonded to gold wires.

In accordance with a preferred embodiment of our invention, a combination of metals almost uniquely commensurate with the above objectives is found to be molybdenum and a malleable metal, preferably aluminum. A thin film of molybdenum is first applied to the surface of the semiconductor device, typically over the entire face of a silicon wafer having a silicon oxide coating with openings etched in contact areas. Then the molybdenum is covered with a thin film of aluminum, and thereafter the aluminum and molybdenum are etched away in unwanted areas, leaving the desired pattern of contacts and interconnections on the silicon surface and on the oxide. Aluminum is used on top because it is of excellent conductivity, and because of the ease with which it can be deposited by evaporation. Moreover, aluminum lends itself nicely to photoresist etch procedures, producing no deleterious effects at the contact-to-wire interface. The underlying molybdenum layer is necessary to prevent aluminum from alloying with or penetrating the silicon. Molybdenum is particularly well suited in this environment because it adheres well to silicon oxide, can be etched in a controlled manner with an etchant not incompatible with other materials present, and does not alloy with and is virtually impervious to aluminum. Moreover, the $\Delta°$ F. for molybdenum oxide is less than that of silicon, so the reaction is not detrimental to a silicon oxide coating, although the adherence thereto is acceptable. Molybdenum makes good electrical contact to silicon if the contact region is heavily doped, preferably above about $10^{21}$ per cc. for either N-or P-type, but yet does not form an alloy with the silicon surface so that shallow junctions are not degraded. In this regard, it might be noted that a virtually "alloyless" contact is formed, the molybdenum not alloying with the silicon and the aluminum not alloying with the molybdenum. It is for this reason that the silicon surface must be free of silicon oxide or other foreign matter where contacts are to be made, and the evaporation procedure used must not permit the formation of molybdenum oxide before aluminum is deposited. In spite of this, the molybdenum and aluminum contacts of this invention may be deposited with the silicon wafer being at reasonably low temperatures.

The novel features believed characteristic of this invention are set forth in the appended claims. The invention itself, however, as well as other objects and advantages thereof, may best be understood by reference to the following detailed description of illustrative embodiments, read in conjunction with the accompanying drawings, wherein:

Figure 1:
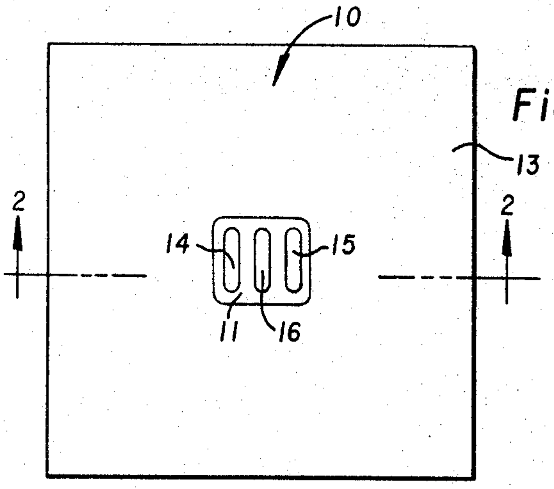
FIGURE 1 is a plan view of a wafer of semiconductor material having a planar transistor formed therein, with holes cut in the oxide coating for application of contacts.
Figure 2:
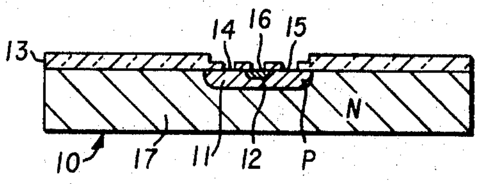
FIGURE 2 is an elevational view in section of the semiconductor wafer of FIGURE 1 taken along the line 2—2.

With references to FIGURES 1 and 2, there is shown a semiconductor wafer 10 having a transistor formed therein including base and emitter regions 11 and 12, respectively, the remainder of the wafer providing the collector region 17. The transistor is formed by the planar technique, using successive diffusions with silicon oxide masking. This process leaves an oxide coating 13 on the top surface of the wafer, with the coating over the collector being thicker than over the base region, leaving the stepped configuration seen in FIGURE 2. For high frequencies, the geometry of the active part of the transistor is extremely small, the elongated emitter region 12 being perhaps 0.1 to 0.2 mil (0.0002 inch) wide and less than a mil long. The base region 11 is about one mil square. A pair of holes 14 and 15 are provided for the base contacts, and a hole 16 for the emitter contact, the latter opening being the same as used for the emitter diffusion. Due to the extremely small size of the actual base and emitter contact areas, one or two tenths of a mil in width, the contacts must be expanded out over the silicon oxide to facilitate bonding of leads for the base and emitter connections, as will be explained below. It may be noted from FIGURE 4 (the regions shown therein being approximately to scale relative to each other) that the thickness of the oxide coating 13 over the base region 11 is much less than over the collector region 17. Also, the shallow depth of the diffused regions, particularly the emitter, may be seen. The large volume of metal compared to that of the oxide or diffused regions emphasizes the problems which would be encountered if any reaction or alloying with the oxide or silicon occurred. The bulk of the wafer 10 forms a collector region 17, and the collector contact may be applied to the lower face of the wafer. The size of the semiconductor wafer is selected for convenience in handling, with a typical size for the wafer 10 being 30 mils on each side and 4 mils thick (these dimensions are not to scale in the drawing). Typically, the wafer 10 is merely a small undivided part of a large slice of silicon, perhaps one inch in diameter and eight mils thick, during all of the process steps described below, and this slice is scribed and broken into individual wafers or dice only after the contacts are applied.

Figure 3:
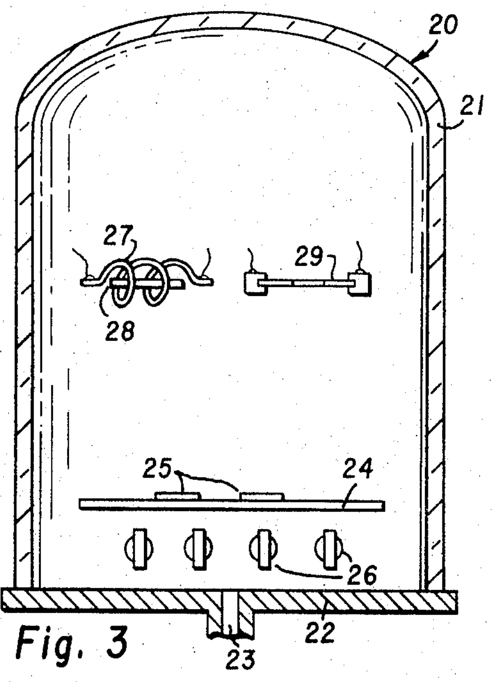
FIGURE 3 is a schematic representation of an evaporation chamber suitable for carrying out the method of applying contacts of this invention.

With reference to FIGURE 3, a method of depositing the molybdenum and aluminum contacts of this invention will be described. The apparatus used for this deposition includes an evaporaiton chamber 20 which comprises a bell jar 21 mounted on a base plate 22. An opening 23 in the base plate is connected to a vacuum pump for evacuating the chamber. A stainless steel sheet 24 is mounted in a thermally isolated manner above the base plate 22 by means not shown, and serves as the work holder for a plurality of silicon slices 25 each of which includes at its upper face, in an undivided form, dozens or hundreds of the transistors of FIGURES 1 and 2. Below the sheet 24 a bank of quartz infrared tubes 26 are positioned, these functioning to heat the sheet and the slices to any desired temperature in the general area of 200–400° C. and to hold the slice temperature at the selected point with a fair degree of precision. A suitable temperature control, including a thermocouple and a feedback arrangement (not shown) is provided for this purpose. About four inches above the sheet 24 there is positioned a tungsten coil 27 for evaporating a charge 28 of aluminum, and also a molybdenum strip 29 which is itself evaporated. The technique used for evaporating molybdenum is somewhat unusual and warrants elaboration. The strip 29 is perhaps 10 mils thick, 3 inches long and one inch wide, while in the center its width is constricted to about one-half inch. Current is passed through the length of the strip 29 until the central part heats up to just below its melting point and begins to evaporate, but care is exercised to insure that the strip does not melt completely through at its center. The strip 29, as well as the tungsten coil 27 and the IR tubes 26, are selectively energized by conductors (not shown) brought out through the base plate 22.

Figures 4, 5:
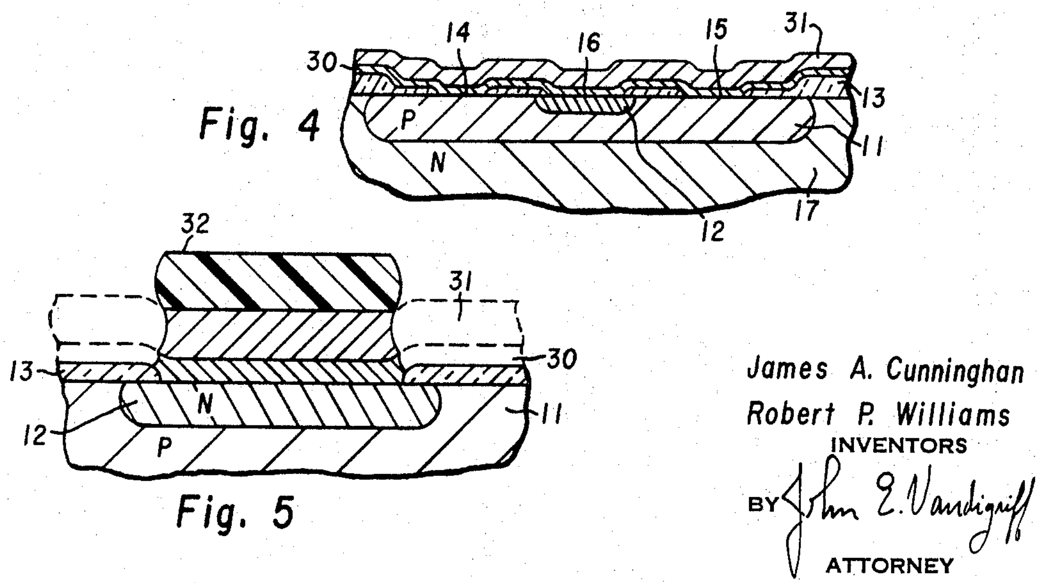
FIGURE 4 is an enlarged elevational view in section of a segment of the semiconductor wafer of FIGURE 1, also along the lines 2—2, after contact material has been applied.
FIGURE 5 is a greatly enlarged elevational view in section of a portion of the view of FIGURE 4 after the contacts have been defined.

The contacts of this invention are deposited utilizing the apparatus of FIGURE 3 by first placing the slices 25 on the work holder, then evacuating the chamber to about $6\times10^{-6}$ mm. of mercury. The slices, of course, have transistors or the like formed in the top surface as set forth above, and the holes for contacts have already been cut. A careful cleaning procedure for the slices, as set forth below, is followed prior to this deposition of contacts. With the slices in place and a vacuum pulled, the IR tubes 26 are energized to bring the temperature of the sheet 24 and the slices 25 up to about 300 to 350° C. The molybdenum strip 29 is then energized by electric current and a molybdenum film 30 as seen in FIGURE 4 is deposited upon the slices 25 entirely over the top surfaces thereof to a thickness of about 6 to 11 microinches. When the proper thickness is reached, the energization of the strip 29 is ceased. The power applied to the infrared tubes 26 is decreased slightly so that the sheet 24 and slices 25 cool to about 250 to 300° C., and the tungsten fialment 27 is then energized to deposit an aluminum film 31 to a thickness of perhaps 15 to 40 microinches upon the entire top face of each slice over the top of the molybdenum film 30. The deposition of aluminum should be done as soon as possible after deposition of molybdenum because there appears to be a tendency for a film of molybdenum oxide, and/or a hydrocarbon film, to form over the molybdenum due to oxygen and oil residue in the vaccum system. Preferably the aluminum evaporation is done within five minutes of the end of the molybdenum evaporation, or as soon as the slices have cooled from the temperature used for molybdenum evaporation to that used for aluminum evaporation. With the deposition of the films 30 and 31 complete, the slices are removed from the evaporation chamber 20 for selective removal of the molybdenum-aluminum coating in the undesired areas by using photographic techniques.

The slice cleaning procedure used prior to the evaporation set forth above will now be described. Unlike aluminum, molybdenum forms no liquid phase with the silicon substrate at reasonably elevated temperatures during evaporation. Thus, the silicon-molybdenum reaction is limited, and for this reason the silicon surface should receive a careful preevaporation cleanup which leaves it very clean to insure good ohmic contact and mechanical adherence. An example of a recommended preevaporation cleanup will thus be given. The silicon slices, with transistors or the like formed therein and contact areas defined by etching, are placed in concentrated sulfuric acid at 150 to 200° C. for about ten minutes, then rinsed in deionized water. The slices are then placed in boiling nitric acid for about five minutes, and again rinsed in deionized water. Thereafter, the slices are dipped in dilute hydrofluoric acid (or a 10% solution of ammonia bifluoride) for about six seconds, rinsed in cold deionized water for about twenty minutes, rinsed in acetone and dried, and then moved immediately into the evaporation chamber for pump-down and evaporation. In this cleanup technique, the function of the hot sulfuric acid is to remove all organic materials from the exposed surface of the silicon and silicon oxide. Such organic materials may be the residue from the photoresist polymer used in forming the transistor. The nitric acid removes the sulfate residue from the previous step. The hydrofluoric acid insures that all oxide is removed from the silicon surface in the contact areas, and this likewise removes some of the oxide coating 13, but since the oxide coating 13 over most of the device is many times thicker than the residue over the base and emitter contact areas, this coating 13 remains essentially intact.

After removing the slices from the evaporation chamber, the excess portions of the molybdenum-aluminum coating 30–31 are removed by subjecting the silicon slices to a selective photoresist masking and etching treatment. A thin coating of a photoresist polymer, Eastman Kodak KMER for example, is applied to the entire top surface of the wafer or slice. The photoresist is exposed to ultraviolet light through a mask which allows light to reach the areas where the molybdenum-aluminum film is to remain. The unexposed photoresist is then removed by developing in a photodeveloping solution. At this point, a layer 32 of photoresist overlies the portion of the molybdenum-aluminum coating which is to form the emitter contact and expanded lead as seen in FIGURE 5. A similar mask would appear over the portion of the metal coating which is to form the base contacts and expanded lead.

The slice is now subjected to an etching solution to remove the unwanted portions of the aluminum and molybdenum layers. A suitable etch solution is 70 milliliters phosphoric acid, 15 milliliters acetic acid, 3 milliliters nitric acid and 5 milliliters of deionized water. The time of etching will vary with the thicknesses of the two layers, but for the thicknesses given in the above example, etching time will be about 45–60 seconds at an etch temperature about 50–70° C.

After the aluminum is etched away, the excess molybdenum is removed by the same etchant in a controlled manner which does not tend to oxidize molybdenum. The phosphoric acid in the solution quickly removes any molybdenum oxide already in place or formed during the etching bath so that the entire etching time is occupied with removal of molybdenum, not molybdenum oxide. Thus, a time may be selected which coincides as nearly as possible with complete removal of the molybdenum coating, no leeway being needed for the variable of molybdenum oxide removal. At a temperature of 50° C., removal of the molybdenum coating 30 is effected in about 20 seconds with this phosphoric acid solution. The photoresist mask such as the layer 32, which has remained intact through these two etching steps, is now removed by rinsing in a solvent such as methylene chloride. An enlarged view of the emitter contact area would appear as in FIGURE 5, where the removed portions of the metal coatings 30 and 31 are dotted. It is seen that very little undercutting occurs.

At some point in the process after deposition of the molybdenum and aluminum layers, it has been found advantageous in some cases to heat the slices to about 400 to 450° C. for perhaps one-half hour to improve adherence of the layers to the slices.

Figure 6:
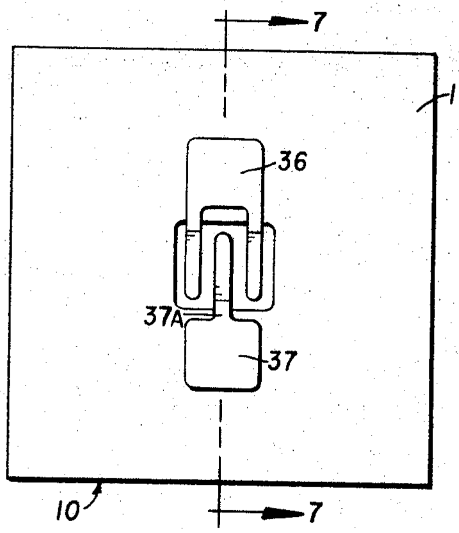
FIGURE 6 is a plan view of the transistor wafer of FIGURE 1 after the contacts and bonding pads have been applied.

Following the selective removal of the molybdenum-aluminum contact material, the slices are secured face down on glass slides with wax and the back or collector sides are etched with HF and nitric acid to reduce the slice thickness down to about 3 to 4 mils. After removing from the slides, the slices are scribed on the top face, and then broken into individual chips or wafers 10. Each wafer will have a contact pattern as seen in FIGURE 6. A base contact land or bonding pad 36 is provided on top of the oxide, and two fingers or strips extend over the base-collector junction into the base contact holes 14 and 15 (see FIGURE 2). Likewise, an emitter contact land 37 or bonding pad is provided, and a single strip 37*a* extends over to make the emitter contact in the hole 16. The fingers or strips are very narrow, about one or two tenths of a mil or less, and so excellent definition or resolution is absolutely necessary. The pads 36 and 37 are large enough to permit bonding of 0.7 to 1 mil wires thereto.

Figure 8:
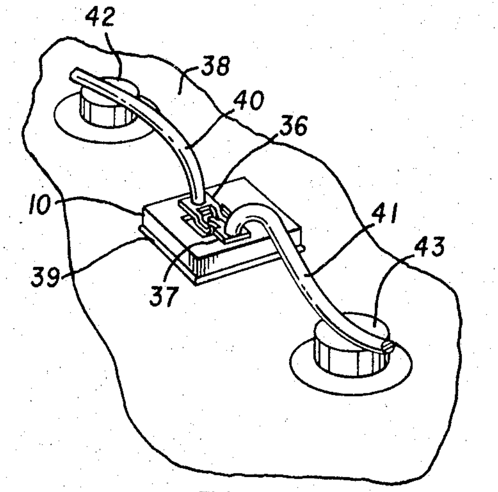
FIGURE 8 is a pictorial view of the transistor of FIGURE 6 mounted on a header.
Figure 7:
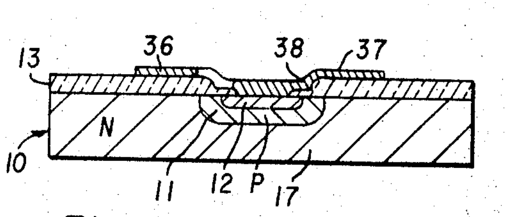
FIGURE 7 is an elevational view in section of the wafer of FIGURE 6 taken along the line 7—7.

The wafer 10 is mounted on a header 38 by a suitable solder material 39 as seen in FIGURE 8, and wires 40 and 41 of perhaps 0.7 mil diameter are ball bonded to the base and emitter pads 36 and 37, respectively. The wires are then bonded to posts 42 and 43 which extend through the metallic header but are insulated therefrom. The collector region 17 of the transistor is thus ohmically connected to the header 38, which forms the collector electrode. A metallic can is thereafter sealed to the header to provide a hermetically sealed space for the transistor wafer.

Figure 9:
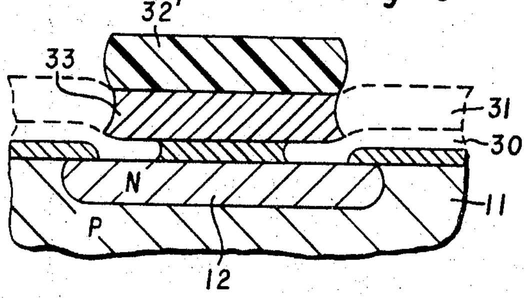
FIGURE 9 is a greatly enlarged elevational view in section of one of the contacts of this invention illustrating a severe undercutting situation.

Returning now to the problem of etching away the unwanted portions of the metal coatings, the difficulties encountered when undercutting occurs may be appreciated by referring to FIGURE 9. Here the emitter contact 12 of FIGURE 5 is illustrated except that undercutting is severe. The underlying layer 30 is etched away far underneath the aluminum layer 31. This illustration is not unrealistic, as will be appreciated when the minute dimensions involved are taken into account. Undercutting of this nature would occur if a material were used for the layer 30 which could not be etched in a controlled manner, or if molybdenum were used but etching continued too long or the etchant did not tend to remove moly oxide. The photoresist masking material 32′ is shown overlying the aluminum layer 31 and the underlying layer 30, with the form of the original aluminum and underlying layers being shown in dotted lines. After the aluminum etching step and then the etching step for the layer 30 are performed, it is seen that the layer 30 is etched away to leave a mechanically weak contact structure which, in addition to electrical degradation, is undesirable since the contact resembles a pedestal and may easily be broken away from the silicon. After the photoresist has been removed, the thin cantilevered edges 33 of the aluminum film would easily droop down and contact the silicon. Then if the device is heated to above the aluminum-silicon eutectic temperature in a later stage of manufacture the device might be destroyed or its characteristics altered by the rapid formation spreading of the aluminum-silicon alloy. It should be noted at this point that the undercutting problem, while present to some extent, does not have such dire consequences when only a single material is used in making the contact.

To provide good, low resistance, ohmic contacts to silicon with molybdenum, it is necessary that the surface regions of the silicon where contact is made be of high impurity concentration, whether N-type or P-type. When boron or phosphorous is used as the impurity the surface concentration for good contact should be greater than $2\times10^{19}$ atoms per cc., and preferably above $10^{21}$. Electricol contact can be made to silicon surfaces that contain lesser concentrations, but the contact resistance increases as the dopant concentration decreases. A sharp break in the plot of contact resistance vs. impurity concentration occurs at about $2\times10^{19}$. In typical transistors such as that described above, the N-type emitter is ordinarily of very high concentration, especially at the surface, since this is the second diffusion. Even though generally of lower concentration than the emitter, the base region is also ordinarily doped heavily enough, at the surface at least, to provide low resistance contact. If not, a shallow P-type diffusion step is introduced prior to evaporation of contact materials. This diffusion would be through holes of about the same size and in the same place as the holes 14 and 15 cut for the base contacts, and preferably the exact same openings are used. In integrated circuits the extra diffusions to produce high surface concentrations in the contact areas are more likely to be necessary. This is because the collector contact is made on top of the wafer to a region which may be an epitaxial layer of low concentration or else may be the first diffusion in a triple diffused device, this first diffusion generally being of fairly low concentration so that the two subsequent diffusions may be made. Also, the base region of the transistor of an integrated circuit is ordinarily made simultaneously with the formation of a diffused resistor. Since the resistivity of the material which forms this diffused resistor region should be fairly high, this requires the base concentration to be fairly low. Accordingly, in a typical integrated circuit with NPN transistors and P-type diffused resistors, the impurity concentration for contacts to the collectors, bases and resistors must be supplemented.

Figure 10:
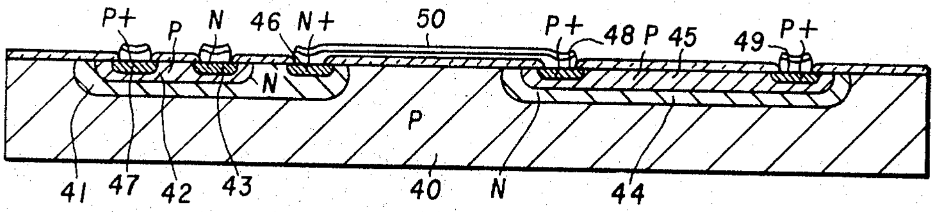
FIGURE 10 is an elevational view in section of an integrated circuit using the contacts and interconnections of this invention.

Referring to FIGURE 10, an integrated circuit is shown in section which comprises a P-type silicon wafer 40 having a transistor formed on the left-hand end by a diffused N-type collector region 41, a P-type base region 42, and an N-type emitter region 43. On the right-hand side, a resistor is provided by first an isolation region 44, then the resistor itself which is a P-type diffused region 45. Before the second N-type diffusion, which forms the emitter region 43, a hole is cut where the collector contact is to be made and a high concentration N+ region 46 is created simultaneously with the emitter region 43. Then high concentration P+ regions 47, 48 and 49 are produced by a subsequent selective boron diffusion using oxide masking. Thereafter holes are cut in the oxide coating where the transistor contacts and the resistor contacts are to be made, the surface is cleaned, and the evaporation procedure as set forth above is used to apply a molybdenum coating and an aluminum coating to the top surface of the device, then the metal coatings are selectively removed to produce the desired pattern of contacts and interconnections. It is seen that the collector is connected to one end of the resistor by an interconnection 50 which extends over the oxide. A typical integrated circuit would include in the same semiconductor wafer many transistors and resistors of the type seen in FIGURE 10, rather than one of each. Of course, the heavily-doped regions under the contacts could be used in the transistor of FIGURE 6.

The necessity for the extra P+ diffusion to provide low contact resistance may be obviated in some cases if a flash or very thin layer of aluminum is applied and alloyed into the silicon prior to depositing the layer of molybdenum on the surface of the device. Since aluminum is a P-type dopant itself, no additional doping is necessary to provide the high surface concentration in the P-type regions. Ordinarily the emitter regions would be very heavily doped N-type, so the addition of a small amount of aluminum would not convert the surface of these regions or degrade the contact resistance. This arrangement takes advantage of the excellent adherence of aluminum to silicon. The rigorous surface preparation is not as critical when aluminum is applied before applying molybdenum. The presence of aluminum in this three-layered contact arrangement, however, introduces some of the problems of degradation due to aluminum passing through pinholes, etc.; severe degradation does not result, however, because the amount of aluminum is limited to a very thin film (much less than that required for the total contact thickness).

It should be noted that the contact arrangement of this invention, comprising evaporated molybdenum and evaporated aluminum, is essentially an "alloyless" system. The molybdenum does not alloy with the silicon and the aluminum does not alloy with the molybdenum. In contrast, when aluminum alone is used, an aluminum-silicon alloy is formed at the contact interface.

While the invention has been described with reference to specific methods and embodiments, it is to be understood that this description is not to be construed in a limiting sense. Various modifications of the disclosed embodiments, as well as other embodiments of the invention, may become apparent to persons skilled in the art without departing from the spirit and scope of the invention as defined by the appended claims.

What is claimed is:

1. A contact and lead arrangement for a semiconductor device of the type including a silicon wafer having a region adjacent one face thereof with a P-N junction between such region and other silicon of the wafer extending to said one face beneath a silicon oxide coating, the coating defining a small opening over said region, the contact and lead arrangement comprising a deposited layer of molybdenum engaging the surface of said region in said opening in the silicon oxide coating, the layer of molybdenum extending from said opening out over said silicon oxide coating in direct contact therewith and over the edge of said junction to a position spaced from said region on said one face, and a deposited layer of aluminum overlying said layer of molybdenum.

2. A contact and lead arrangement for a semiconductor device of the type including a semiconductor wafer having a region adjacent one face thereof with a junction between such region and other semiconductor material of the wafer extending to said one face beneath an insulating coating, the contact and lead arrangement comprising a deposited thin film of a first metal engaging the surface of said region in an opening in said insulating coating, the film of said first metal extending out over said insulating coating and over the edge of said junction to a position spaced from said opening on said one face, and a deposited thin film of aluminum overlying all portions of said film of the first metal, the first metal being adherent to the semiconductor material of the wafer and to said insulating material and being substantially unalloyed with the surface of the wafer and with the thin film of aluminum.

3. A contact and lead arrangement for a semiconductor device of the type including a semiconductor wafer having a region adjacent one face thereof with a P-N junction between such region and other semiconductor material of the wafer extending to said one face beneath a silicon oxide coating, the contact and lead arrangement comprising a deposited thin film of a first metal engaging the surface of said region in an opening in said insulating coating, the film of first metal extending out over said insulating coating and over the edge of said junction to a position spaced from said region on said one face, and a deposited thin film of aluminum overlying all portions of said film of the first metal, the first metal being adherent to the semiconductor material of the wafer and to said insulating coating.

4. A semiconductor device comprising a silicon wafer having a shallow region near one face thereof with a P-N junction between such region and other silicon of the wafer extending to said one face beneath a silicon oxide coating, a deposited layer of molybdenum engaging the surface of said region in an opening in said oxide coating, the region being very heavily doped near the surface under said opening, the layer of molybdenum extending from said opening out over said oxide coating and over the edge of said junction to a position spaced from said opening, a thin deposited layer of aluminum covering all portions of said film of molybdenum, and conductive means electrically connected to said layer of aluminum at said position.

5. A contact and lead arrangement for a semiconductor device of the type including a silicon wafer having a shallow region adjacent one face thereof with a P-N junction between such region and other silicon of the wafer extending to said one face beneath a silicon oxide coating, the contact and lead arrangement comprising a deposited film of molybdenum engaging the silicon surface of said region in an opening in said silicon oxide coaing, the film of molybdenum extending out over said silicon oxide coating and over the edge of said junction to a position spaced from said region on said one face, and a deposited film of aluminum overlying all portions of said film of molybdenum, the film of aluminum being spaced from the surface of the silicon wafer and from the silicon oxide coating by means of the film of molybdenum, the film of molybdenum being substantially unalloyed with the silicon surface and with the film of aluminum, and a wire compression bonded to the film of aluminum at said position.

6. A semiconductor device comprising a silicon wafer, a silicon oxide coating on one face of the wafer defining an opening, a shallow region adjacent one face of the wafer generally beneath said opening with a P-N junction between such region and contiguous portions of the wafer extending to said one face beneath the silicon oxide coating, a deposited thin film of molybdenum on said one face engaging the surface of said region in said opening in the silicon oxide coating, the film of molybdenum extending from said opening out over said silicon oxide coating in direct contact therewith and over the edge of said junction to form a bonding pad spaced from said region on said one face, a deposited thin film of aluminum overlying all portions of said film of molybdenum, and a malleable wire much larger in diameter than the smallest dimension of said opening compression bonded to the film of aluminum over said bonding paid.

7. A semiconductor device comprising a semiconductor body, a plurality of monocrystalline semiconductor regions adjacent one face of the body spaced and separated from one another along said one face, each region including at least one P-N junction extending to the semiconductor surface beneath an insulating coating, the coating extending across said face between the regions, and multilayered contacts to such regions and interconnections between such regions consisting of a layer of molybdenum on said one face within said opening and extending over the coating across the junctions to other of the openings, and a layer of aluminum overlying said layer of molybdenum.

8. A contact for a shallow region adjacent one face of a silicon semiconductor device of the type having a silicon oxide coating thereon with an opening over said region, comprising a layer of molybdenum engaging the surface of the silicon within said opening and extending out over the surface of the silicon oxide coating to form a bonding pad spaced from said region, a layer of aluminum much thicker than the layer of molybdenum overlying said layer of molybdenum, a wire compression bonded at one end to the layer of aluminum over said bonding pad, an electrode spaced from the semiconductor device and having a surface composed of aluminum, the wire being bonded at its other end to said electrode.

9. A semiconductor device comprising a semiconductor body and a multilayered contact consisting of a layer of molybdenum contacting said semiconductor body and a layer of aluminum overlying said layer of molybdenum.

10. A semiconductor device comprising a silicon wafer, a protective coating on one face of said wafer defining an opening, a deposited thin film of molybdenum on said one face of contacting the surface of said wafer at said opening, the film of molybdenum extending from said opening out over said protective coating, and a deposited thin film of a malleable metal overlying said film of molybdenum.

11. The device as defined in claim 10 wherein said malleable metal is aluminum.

12. An ohmic contact and expanded lead arrangement for a semiconductor device of the type including a semiconductor body having a region adjacent one face thereof with a junction between said region and other semiconductor material of the body, said junction extending to said one face beneath an insulating coating upon said one face, the contact and expanded lead arrangement comprising:

(a) a first thin film comprised of molybdenum ohmically engaging the surface of said region in an opening in said insulating coating and extending out over said insulating coating and over the edge of said junction to a position spaced from said opening along said one face,
(b) a second thin film of highly conductive metal overlying said first thin film at said spaced position providing a bonding area, and
(c) conductive means ohmically engaging said overlying film at said bonding area.

13. An integrated circuit semiconductor device, comprising:

(a) a plurality of electronic components within one major face of a semiconductor substrate, said plurality of electronic components having regions of opposite conductivity type with P-N junctions therebetween extending to said one major face,
(b) an insulating layer upon said one major face overlying said P-N junctions and having openings therein over select ones of said regions, and
(c) a multilayer expanded ohmic contact within said openings and extending over said insulating coating to interconect said select ones of said regions, said multilayer expanded ohmic contact including a layer comprised of molybdenum and an overlying layer of highly conductive metal.

References Cited

UNITED STATES PATENTS 3,266,127 8/1966 Harding et al.
3,290,570 12/1966 Cunningham et al. ---- 317—240

JOHN W. HUCKERT, *Primary Examiner.*

A. LESNIAK, *Assistant Examiner.*